(12) United States Patent
Lercel

(10) Patent No.: US 6,528,215 B1
(45) Date of Patent: Mar. 4, 2003

(54) SUBSTRATE FOR DIAMOND STENCIL MASK AND METHOD FOR FORMING

(75) Inventor: Michael J. Lercel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 09/707,356

(22) Filed: Nov. 7, 2000

(51) Int. Cl.$^7$ .............................. G03F 9/00; B32B 9/00
(52) U.S. Cl. ............................... 430/5; 428/428
(58) Field of Search ......................... 430/5, 296, 322; 378/34, 35; 428/428; 250/492.3; 117/89

(56) References Cited

U.S. PATENT DOCUMENTS

| | | | |
|---|---|---|---|
| 4,978,421 A | 12/1990 | Bassous et al. ............ 156/645 |
| 5,108,779 A | 4/1992 | Gasworth ................... 427/39 |
| 5,160,405 A | 11/1992 | Miyauchi et al. ........... 156/643 |
| 5,288,650 A | 2/1994 | Sandow ...................... 437/24 |
| 5,471,947 A | 12/1995 | Southworth et al. ......... 117/94 |
| 5,661,044 A | 8/1997 | Holland et al. ............ 438/766 |
| 5,728,492 A | 3/1998 | Kawata ....................... 430/5 |
| 5,853,478 A | * 12/1998 | Yonehara et al. ............ 117/89 |
| 5,912,095 A | * 6/1999 | Katakura ....................... 430/5 |
| 5,935,793 A | 8/1999 | Bayer et al. .................... 430/5 |
| 6,051,346 A | 4/2000 | Kornblit et al. ................ 430/5 |
| 6,090,689 A | * 7/2000 | Sadana et al. ............ 438/480 |
| 6,261,726 B1 | * 7/2001 | Brooks et al. ................. 430/5 |

* cited by examiner

Primary Examiner—S. Rosasco
(74) Attorney, Agent, or Firm—Schmeiser, Olsen & Watts

(57) ABSTRACT

In accordance with the present invention, a method for forming a stencil mask from a difficult to form material, such as diamond, is provided. A stencil mask formed of diamond in accordance with the present invention provides advantageous properties of heat transmission and stiffness. The method in accordance with the present invention utilizes a nucleation layer over an etch stop layer. The nucleation layer facilitates the growth of a diamond film. The etch stop layer may comprise a buried oxide layer and the nucleation layer may comprise a thin layer of silicon. The buried oxide layer provides an etch stop for use in the definition of the diamond membrane and in the etching of the diamond layer to form the stencil. The use of the buried oxide layer as an etch stop provides improved profile control of the etches.

41 Claims, 9 Drawing Sheets

SUBSTRATE FOR DIAMOND STENCIL MASK AND METHOD FOR FORMING

GOVERNMENT RIGHTS

Figure 1:
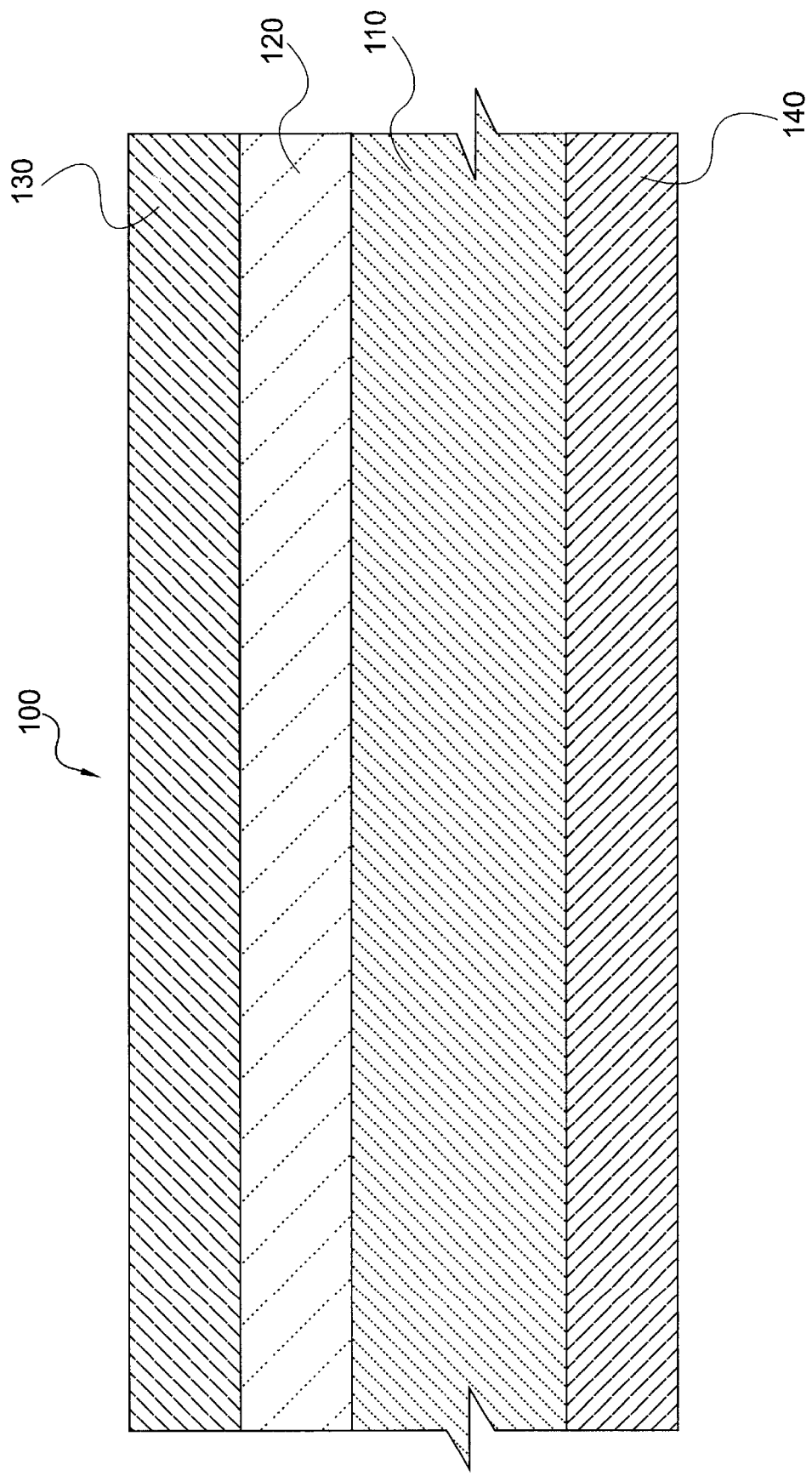

This invention was made with U.S. Government support under Agreement No.N00019-99-3-1366 awarded by the Naval Air Systems Command. The U.S. Government has certain rights in the invention.

BACKGROUND OF THE INVENTION

I. Field of the Invention

The present invention relates generally to lithographic semi-conductor processing. More particularly, the present invention relates to a method for forming a diamond stencil mask for use in lithographic patterning of semi-conductors devices and circuitry.

II. Description of the Prior Art

The diminution of structures produced on semi-conductors has steadily progressed in recent years. Traditionally, photolithographic processes have been used to create structures on semiconductors. These traditional photlithographic processes employ optical processes to create an "image" of the structures to be produced on the semi-conductor substrate. These optical "images" are captured in methods similar to photographic development.

The reduced size of structures produced on semi-conductors, however, increasingly requires lithographic methods other than traditional photolithography. To this end, new lithographic techniques have been developed. For example, electron beam lithography uses electrons, rather than the photons of traditional photolithography, to produce a lithographic image on a substrate. The use of electrons, rather than photons, allows for the creation of smaller images, as the shorter wavelength of electrons allows superior resolution than even very high energy photons.

Traditional lithography utilizes an optical mask to form the image on the substrate. An optical mask includes sections that are transparent to the wavelength of light used in the photolithographic process. The image is formed on the substrate by the selective transmission of light through the optical mask to the substrate. Stencil masks, commonly referred to simply as stencils, have been developed to perform the same function in ion beam and electron beam lithography as an optical mask performs in photolithography. A stencil is the physical structure that selectively blocks radiation such as electrons or ions from transmission from a source to the substrate. Stencils, unlike optical masks, use openings or perforations extending through the stencil rather than a transparent section of material to allow for the selective transmission of radiation. The reason for this difference is that the radiation used with stencils, such as ions and electrons, cannot pass through a "transparent" material unless that material is so thin as to be impractical to use in a lithographic process. Hence, openings in the stencil correspond to areas of the substrate that are exposed, while opaque portions of the stencil correspond to portions of the substrate that do not receive radiation. This selective blocking of radiation creates an image upon the substrate that is subsequently converted into the electronic structures on the semi-conductor.

Traditionally, stencils for use in conventional photolithography and electron beam lithography have been constructed of silicon. Typically, the stencils themselves are fabricated using lithographic techniques. In the past, silicon has been an acceptable material for use as a stencil because it is readily available, fairly durable, and undergoes limited expansion/distortion during use for traditional lithography. Other materials, however, may prove superior to silicon for use as a stencil material, particularly for use with electron beam or ion beam lithography.

Electron beam lithography presents unique challenges in the production and use of stencils. The creation of a stencil comprises a trade off between the stencil fabrication process and stencil durability. In general, a thinner stencil may be fabricated more easily than a thicker stencil. A thicker stencil will typically provide advantages of rigidity and durability over a thinner stencil, but generally will also be more difficult to fabricate. Designing a silicon stencil is thus a trade off between ease of fabrication and utility.

The use of a silicon stencil with electron beam lithography poses problems of heat effects. Electron beam lithography creates more heat in the mask than conventional photolithography. The heating of the stencil causes it to expand, which can lead to the distortion of image placement. There are two properties of a material that determine how great a problem the heating of the stencil is. One characteristic of a material relevant to its performance as a stencil is the thermal conductivity of the material used to create the stencil, which describes how effectively the stencil transmits heat. While thermal conductivity is a general characteristic of materials, this characteristic is critical in stencil design because a material will heat in response to exposure to an electron beam or an ion beam. The second property of a material relevant to its performance as a stencil is its coefficient of expansion, which determines how much the material expands due to heating.

Silicon's thermal conductivity and its coefficient of expansion are both acceptable for use in current electron beam lithography, but may not be acceptable for use in electron beam lithography as the critical dimensions of printed images continue to shrink. The use of a silicon stencil in electron beam lithography can distort image placement due to the heating and expansion of the stencil. This distortion of the image placement poses a relatively greater problem as image size reduces. Of course, the creation of reduced images is the impetus for using electron beam lithography. Accordingly, other materials are needed to permit the effective use of electron beam lithography in semi-conductor fabrication.

One material that addresses the concerns of reduced thickness as well as concerns regarding the heating of the stencil is diamond. The thermal coefficient for diamond is considerably greater than for silicon, which correlates with less heating and therefore less expansion in a diamond stencil as compared to a silicon stencil. Specifically, diamond's thermal conductivity is more than six times greater than the thermal conductivity of silicon. Silicon's thermal conductivity is 156 watts/(meter)(° Celsius), while diamond's thermal conductivity is approximately 1000 watts/(meter)(° Celsius).

As a result, a diamond stencil used in electron beam lithography does not heat as much as a silicon stencil would, resulting in less expansion of the diamond stencil. Diamond is also well known for its strength and durability. Young's modulus for diamond, which describes its stiffness, is 900 GPa, compared to a Young's modulus of 160 GPa for silicon. This strength and durability allows a stencil made from a diamond to be thin relative to a traditional silicon stencil without sacrificing durability. This enhanced stiffness also serves to reduce image displacement caused by physical distortions of the stencil. Accordingly, diamond makes an excellent choice for a stencil material for use with electron beam lithography.

The use of diamond stencils for electron beam lithography, while providing several advantages, also creates certain difficulties, particularly with regard to the fabrication of diamond stencils. One challenge in using diamond as a stencil material is the difficulty in forming a high quality diamond layer upon different starting materials. Diamond is particularly difficult to grow over an oxide layer. However, an oxide layer underlying a diamond layer is useful, as its use as an etch stop provides improved etch profile control when the diamond layer is etched.

Another obstacle to the creation of diamond stencils for use in lithography has been the lack of a technique to allow for sufficient profile control in etches of the diamond stencil. The present invention overcomes these impediments to the use and creation of diamond stencils by using a nucleation layer upon which a diamond film is grown and providing an etch stop layer for use in the formation of a diamond stencil.

III. SUMMARY OF THE INVENTION

The present invention comprises a method for forming a diamond stencil for use in lithography, particularly electron beam lithography. In accordance with the present invention, a thin diamond layer is formed on a substrate using a nucleation layer to assist in growing a diamond film. In accordance with the preferred embodiment of the present invention, the substrate used includes an etch stop layer, such as a buried oxide layer, below the nucleation layer. This etch stop layer later serves as an etch stop in both a backside reactive ion etch used to expose the diamond membrane and a front side etch of the diamond to form stencil openings. This use of an etch stop allows for better control of the etch processes, and therefore allows the formation of a more well defined stencil.

IV. BRIEF DESCRIPTION OF DRAWINGS

Figure 7:
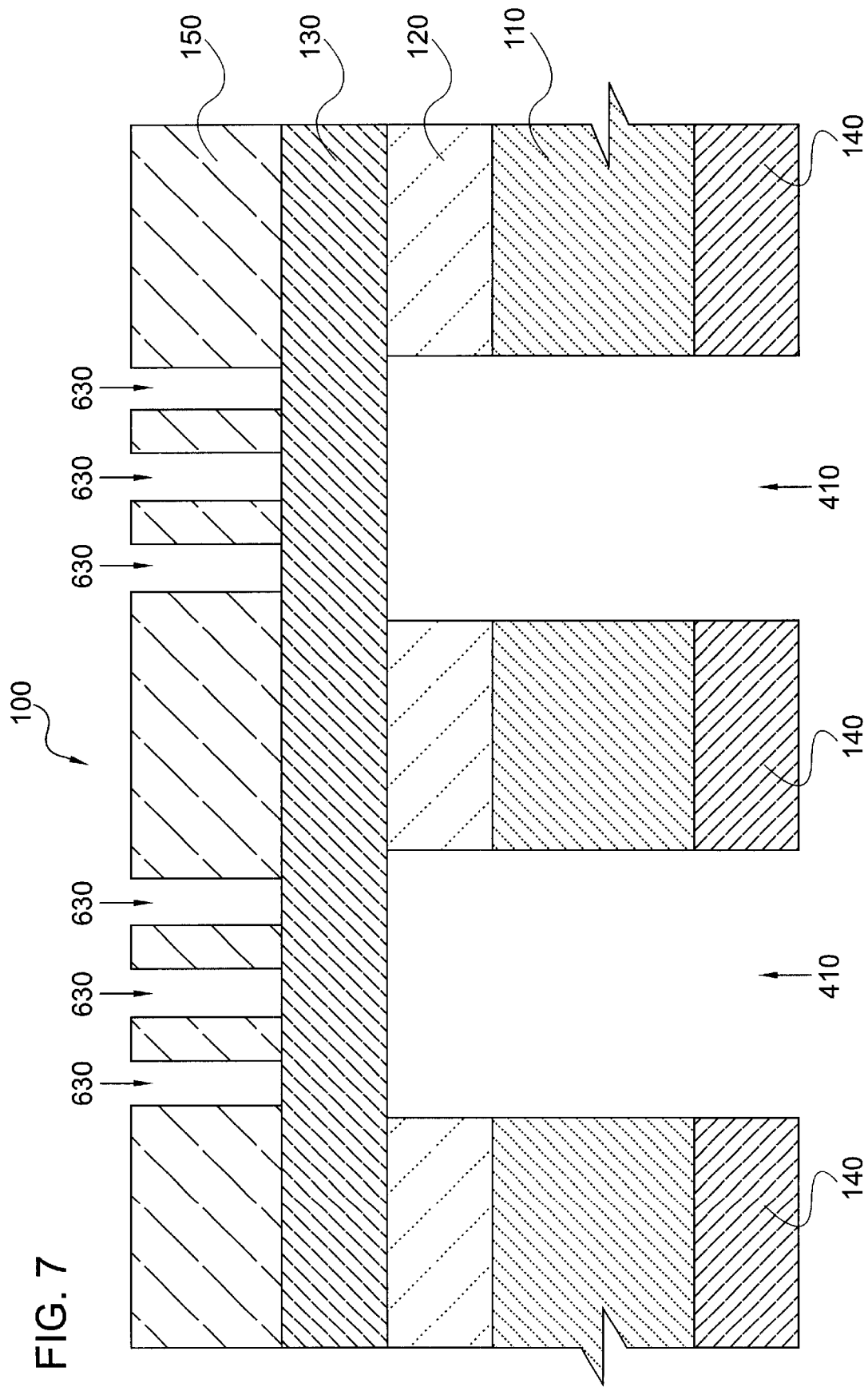
Figure 8:
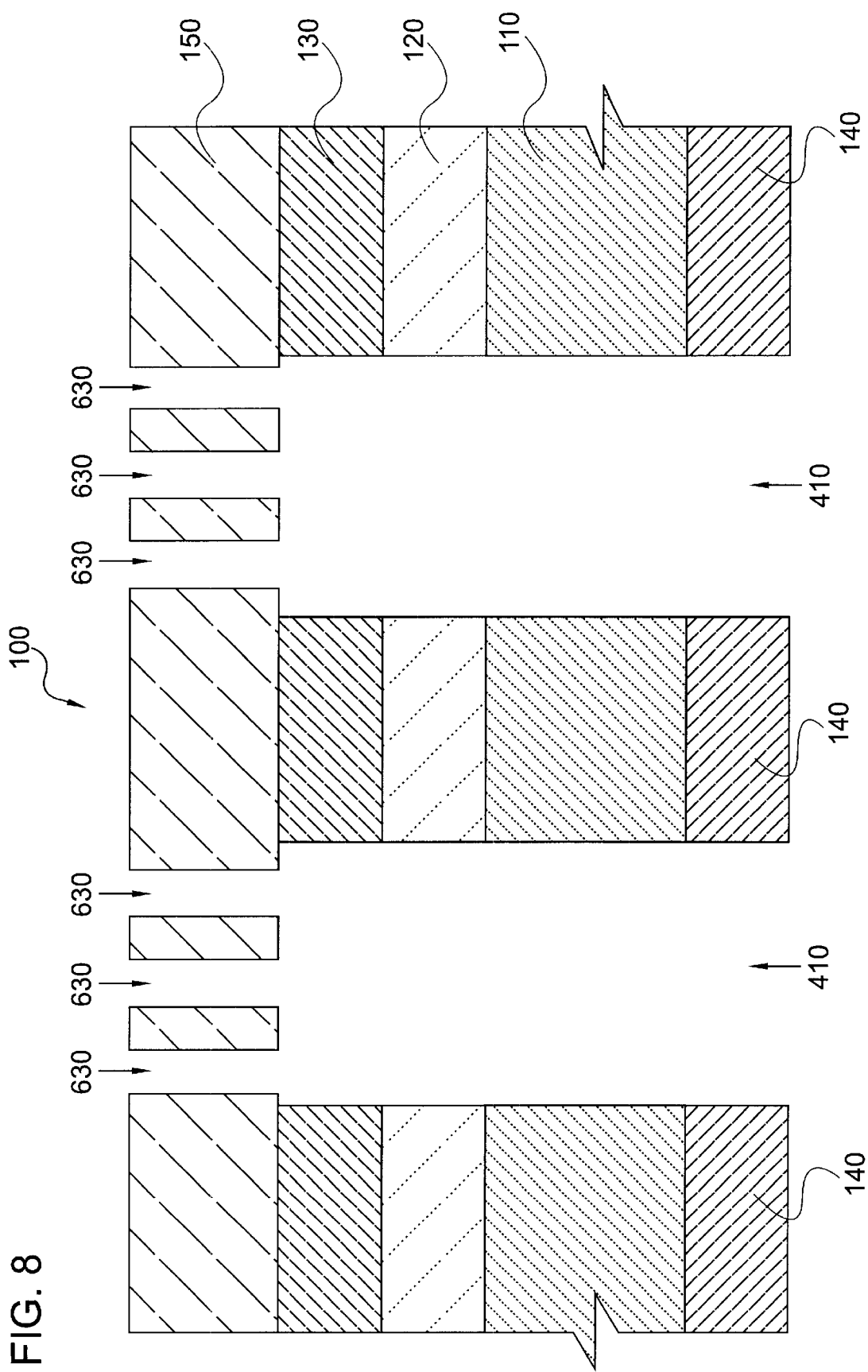
Figure 9:
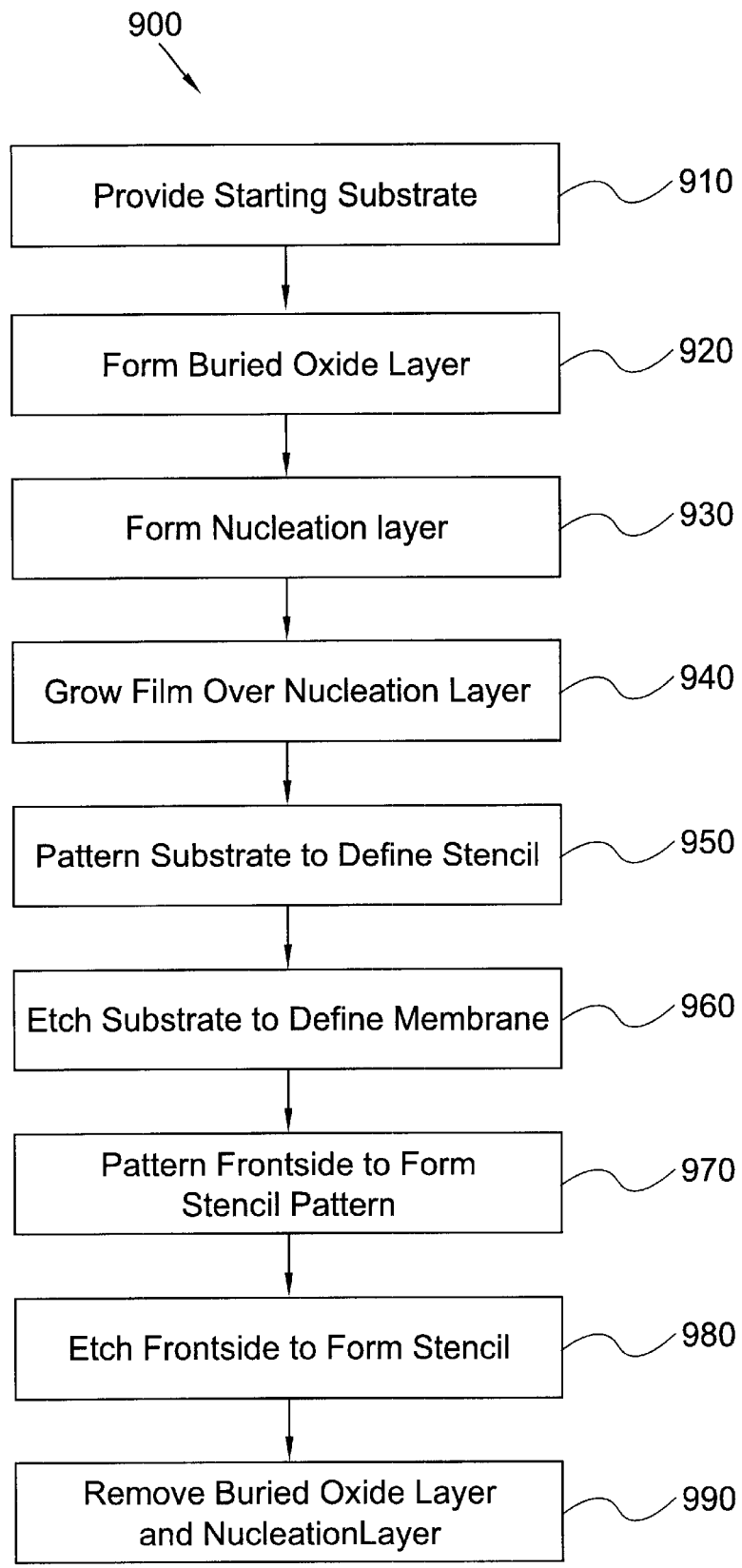

FIGS. 1–8 illustrates substrates at various steps in the process of forming a diamond stencil in accordance with the present invention; and FIG. 9 is a flow diagram illustrating a method for forming a diamond stencil mask in accordance with the present invention.

V. DETAILED DESCRIPTION OF THE PREFERRED EMBODIMENT

A method and stencil structure in accordance with the present invention are illustrated in the FIGS. FIG. 9 illustrates a method 900 in accordance with the present invention. The method 900 in accordance with the invention begins with step 910 of providing a starting substrate. A starting substrate may typically comprise a silicon wafer. The next step 920 is to form an etch stop layer. A variety of materials may be used for the etch stop layer. For example, silicon oxide, silicon nitride, silicon oxynitride, aluminum oxide, aluminum nitride, and silicon carbide may be used as etch stop layers. In accordance with the preferred embodiment of the present invention, the etch stop layer comprises a buried silicon oxide layer on the substrate. The buried oxide layer may be approximately one micron thick. One skilled in the art will be familiar with numerous methods of forming a buried oxide layer. For example, an oxide layer could be formed on a silicon wafer using known techniques such as chemical vapor deposition or furnace oxidation, with the subsequent formation of a layer of silicon over the oxide layer as described below.

After forming a buried oxide layer, a nucleation layer is formed in step 930 over the buried oxide layer. The nucleation layer may suitably comprise a thin layer of silicon formed through any of a variety of methods, such as sputtering, chemical vapor deposition, or evaporation. Alternatively, a silicon on oxide wafer could be formed using, for example, the sacrificial wafer method or oxygen implantation. If a silicon on oxide wafer is used, the layer of silicon above the buried oxide layer will comprise the nucleation layer.

FIG. 1 illustrates a substrate after step 930 has been completed. The substrate 100 comprises a silicon wafer 110, a buried oxide layer 120 to serve as an etch stop layer, and a nucleation layer 130 above the buried oxide layer 120. As noted above, the nucleation layer 130 may comprise a thin layer of silicon. The nucleation layer 130 may be roughened by, for example, using a sputtering technique. This roughening of the nucleation layer 130 will facilitate the subsequent growth of a diamond layer. The thickness of the nucleation layer 130 will be determined by the method used in creating the nucleation layer 130. The nucleation layer 130 should be thick enough to allow it to be roughened without removing the nucleation layer 130 in the process of such roughening. A thinner nucleation layer 130 may be expected to experience less intrinsic stress than a thicker nucleation layer 130. As shall be explained, the nucleation layer 130 will be removed during a subsequent step of method 900. When a layer such as the nucleation layer 130, is removed, the relaxation of the layer's intrinsic stress causes features on an adjoining layer to shift. As a thinner nucleation layer 130 will experience less intrinsic stress, a relatively thin nucleation layer 130 is desirable so as to avoid the shifting of features in the diamond stencil.

A nucleation layer 130 in accordance with the present invention may range in thickness from about 5 nanometers to about 1 micron. Preferably, the thickness of a nucleation layer 130 in accordance with the present invention will range in thickness from about 50 nanometers to about 100 nanometers, and ideally a nucleation layer 130 in accordance with the present invention will be about 100 nanometers thick.

In selecting a material for use as a nucleation layer a material should be selected that is easily deposited, easily removed during subsequent processing, and consists of an atomic or molecular arrangement or structure that facilitates the growth of diamond upon the material.

Examples of materials other than conventional crystalline silicon that may serve as acceptable for use as a nucleation layer include amorphous carbon, silicon carbide, amorphous silicon and polycrystalline silicon. While materials other than silicon may be used for the nucleation layer 130, silicon functions well in this role because its crystalline structure resembles the crystalline structure of diamond closely enough to facilitate the growth of a diamond layer upon the silicon. It is to be noted that the inclusion of a backside hard mask 140 on the backside of the silicon wafer 110 may be desirable for purposes that will become apparent shortly.

Figure 2:
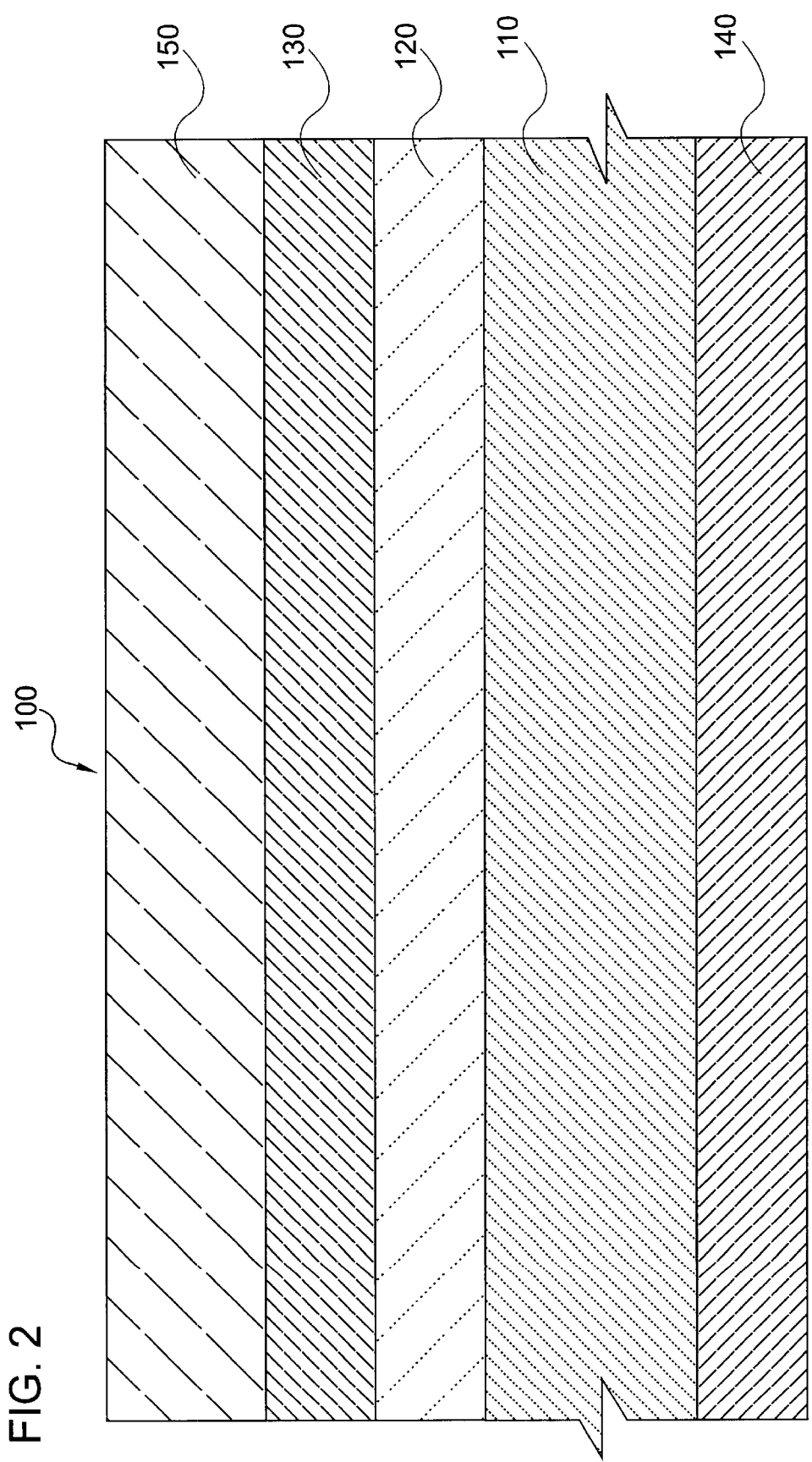

Returning now to the method 900, the next step 940 is to grow a film over the nucleation layer. In accordance with the preferred embodiment of the present invention, a diamond film is grown in step 940. This is illustrated more fully in FIG. 2. As can be seen in FIG. 2, a diamond layer 150 has been grown on top of the nucleation layer 130. The diamond layer 150 may be grown using processes that are well known in the art, such as chemical vapor deposition and sputtering. As is known in the art, the growth of a diamond crystal must be conducted carefully to avoid the creation of an amorphous carbon material, which lacks the advantageous properties of diamond. The use of a nucleation layer 350 greatly facilitates successful diamond growth. The diamond layer 150 will later be used in the formation of the stencil. The diamond layer 150 may be appropriately two microns thick, and may suitably range from about 0.1 to 10 microns in thickness. While a thinner diamond layer 150 is easier to pattern and may possess superior lithographic properties, a thick diamond layer 150 is more durable.

Figure 3:
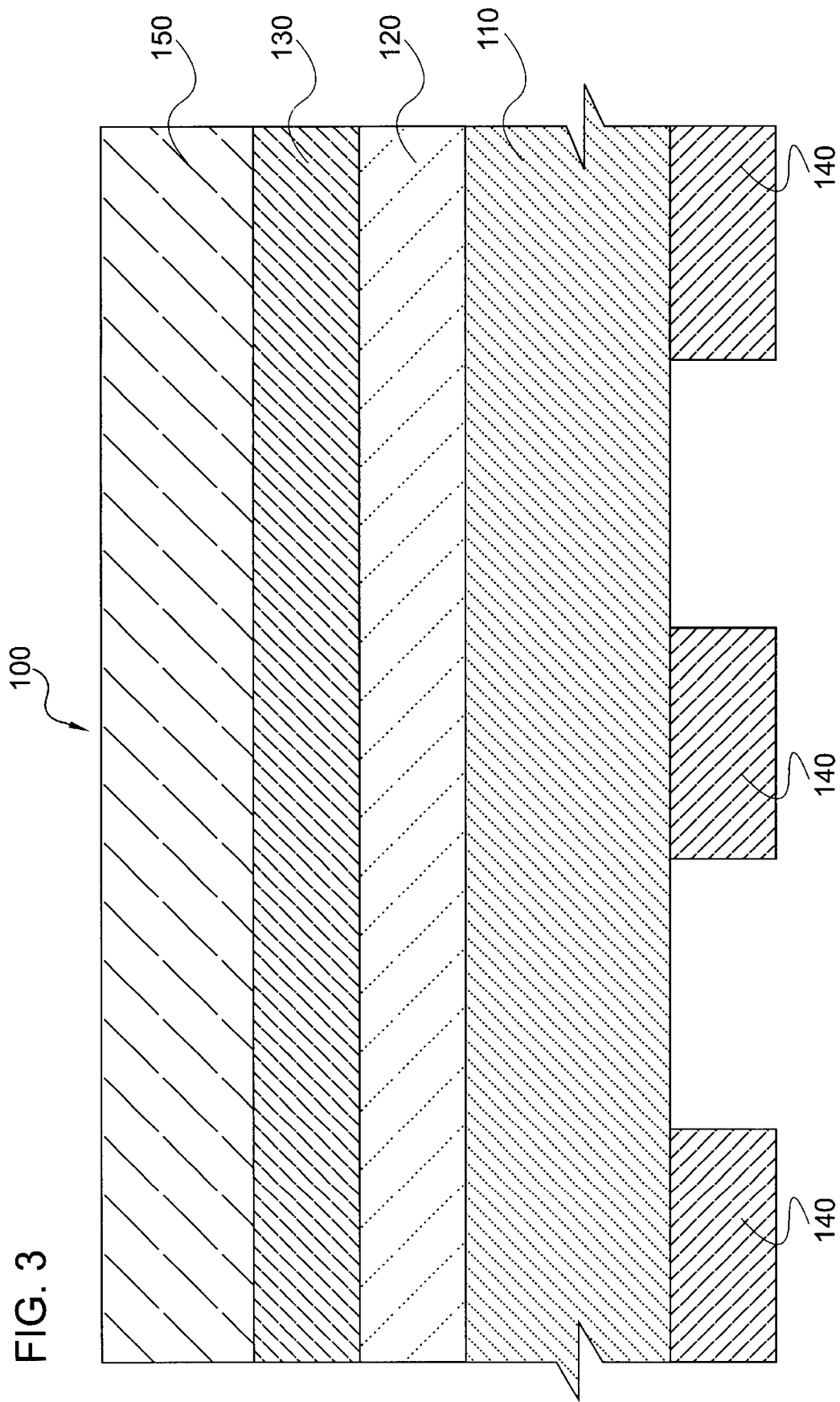

Returning to method 900, the next step 950 is to pattern the substrate 100 for a backside etch to define the stencil. This is illustrated more fully in FIG. 3. As shown in FIG. 3, the backside hardmask 140 has been lithographically exposed to create a pattern to be used in the formation of the membrane. This will ultimately define the portions of the diamond layer 150 exposed to function as a membrane.

The next step 960 of method 900 is to perform an etch of the silicon wafer to define the portions of the diamond layer 150 that will be exposed to form the membrane. In step 960 numerous materials and chemicals may be used. One skilled in the art will realize that several chemistries may be useful in this purpose.

Figure 4:
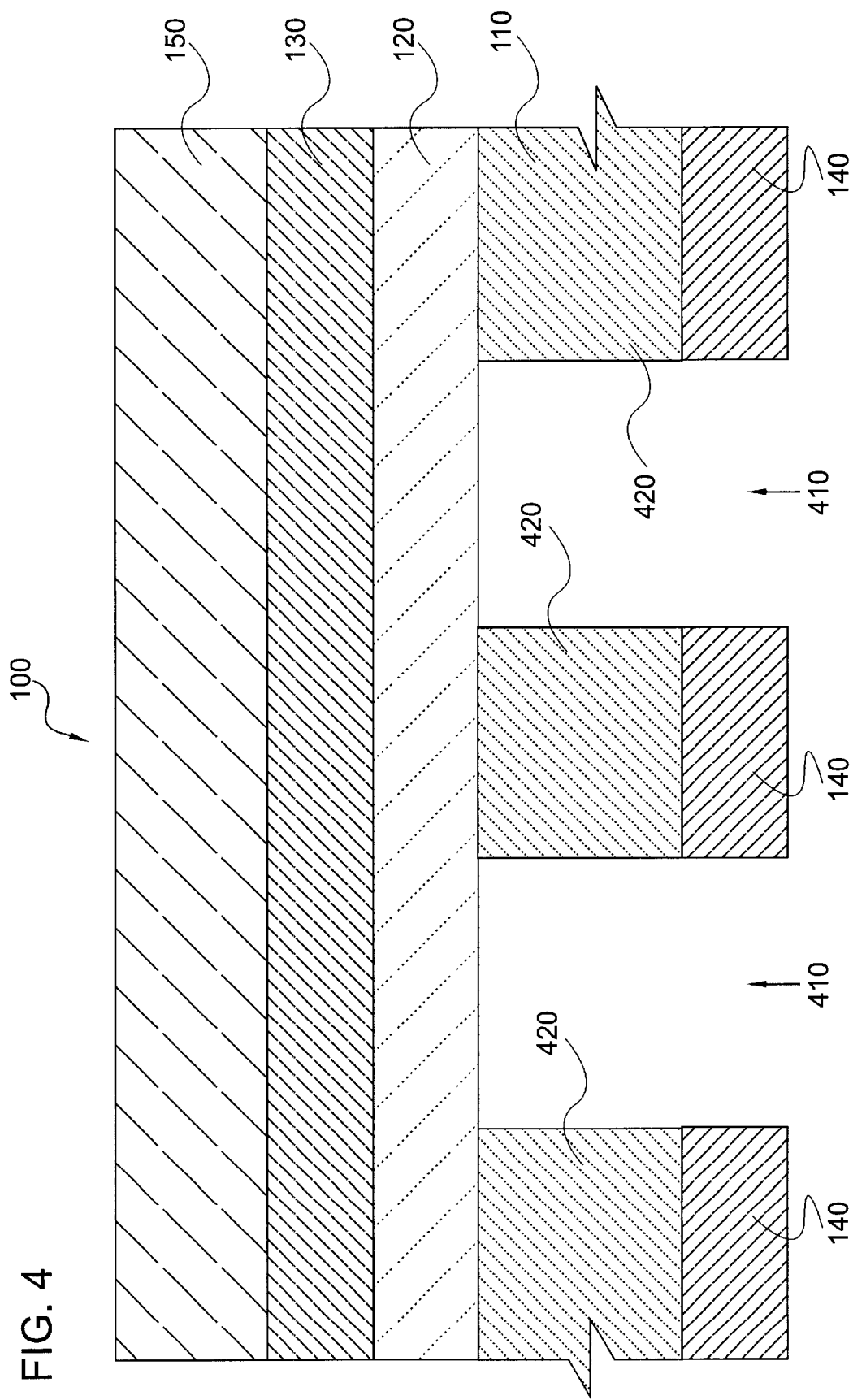

FIG. 4 illustrates a substrate 100 after step 960. The etch process has created shafts 410 through the silicon wafer 110 to expose the buried oxide layer 120 from the backside. Struts 420 of silicon remain to physically support the diamond layer 150 to enhance the stencil's rigidity and durability.

The next step 970 of the method 900 is to pattern the diamond layer 150 on the front side of the substrate 100 to form the stencil pattern. One skilled in the art will realize that this may involve the application of a resist layer to the diamond layer 150 and the appropriate exposure of that resist to define the pattern to be formed in the diamond layer 150. For example, step 970 will define a pattern with a critical dimension of approximately 400 nanometers, although this dimension will almost certainly reduce as lithographic techniques continue to advance.

Figure 5:
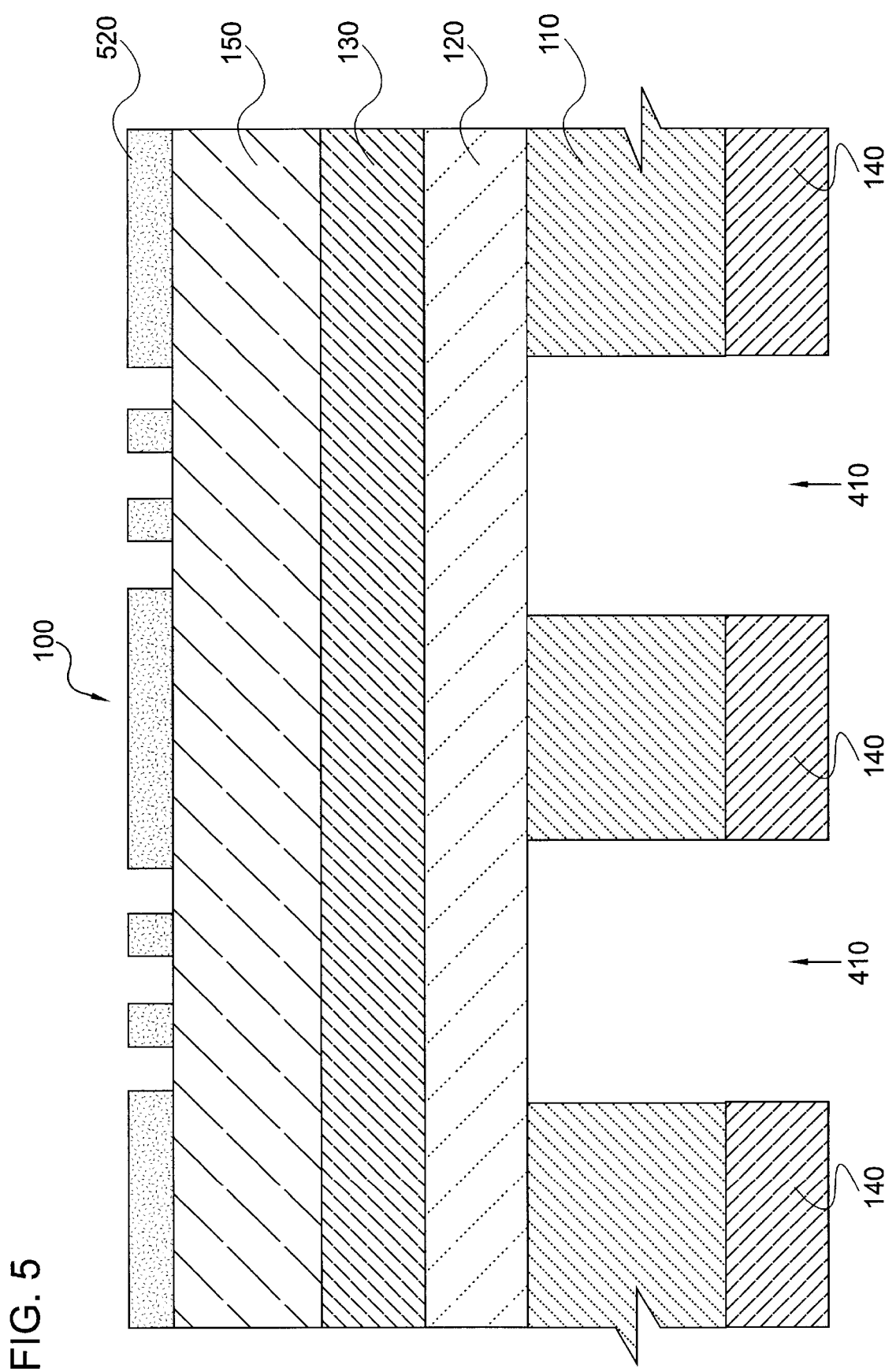

FIG. 5 illustrates a substrate 100 after the conclusion of step 970. As can be seen in FIG. 5, a resist layer 520 has been applied over the diamond layer 150. The resist layer 520 has been exposed to form a pattern. This pattern will be used in the creation of the diamond stencil. One skilled in the art will realize that the lithographic process used to create the pattern is not important to the underlying invention. Accordingly, conventional photolithography, electron beam lithography, or other lithographic techniques may be used in the formation of the pattern.

Step 970 of patterning the diamond layer 150 may alternatively utilize a hardmask placed over the diamond layer 150. The hardmask would then be patterned, with the hard mask pattern subsequently transferred to the diamond layer 150. The use of a hard mask is presently more practical than directly patterning the diamond layer 150.

The next step 980 of method 900 is to etch the front side of the substrate 100 to form the stencil. In this step 980 the diamond layer 150 is etched to form the openings in the eventual stencil. Diamond may be etched using an appropriate oxygen chemistry. The buried oxide layer 120 is used as an etch stop during the etch process. This use of the buried oxide layer 120 allows for enhanced profile control at the bottom of the etch. The use of the buried oxide layer 120 as an etch stop also allows for the use of a backside cooling method during the etch of step 980. The use of backside cooling methods enhances the uniformity of the etch process and improves the profile control for the etch of the diamond layer 150. Backside cooling, enhanced by diamond's thermal conductivity, minimizes the temperature gradient across the diamond layer 150. Reducing the temperature gradient across the diamond layer 150 increases the uniformity of the etch rate and reduces variations in image size.

Figure 6:
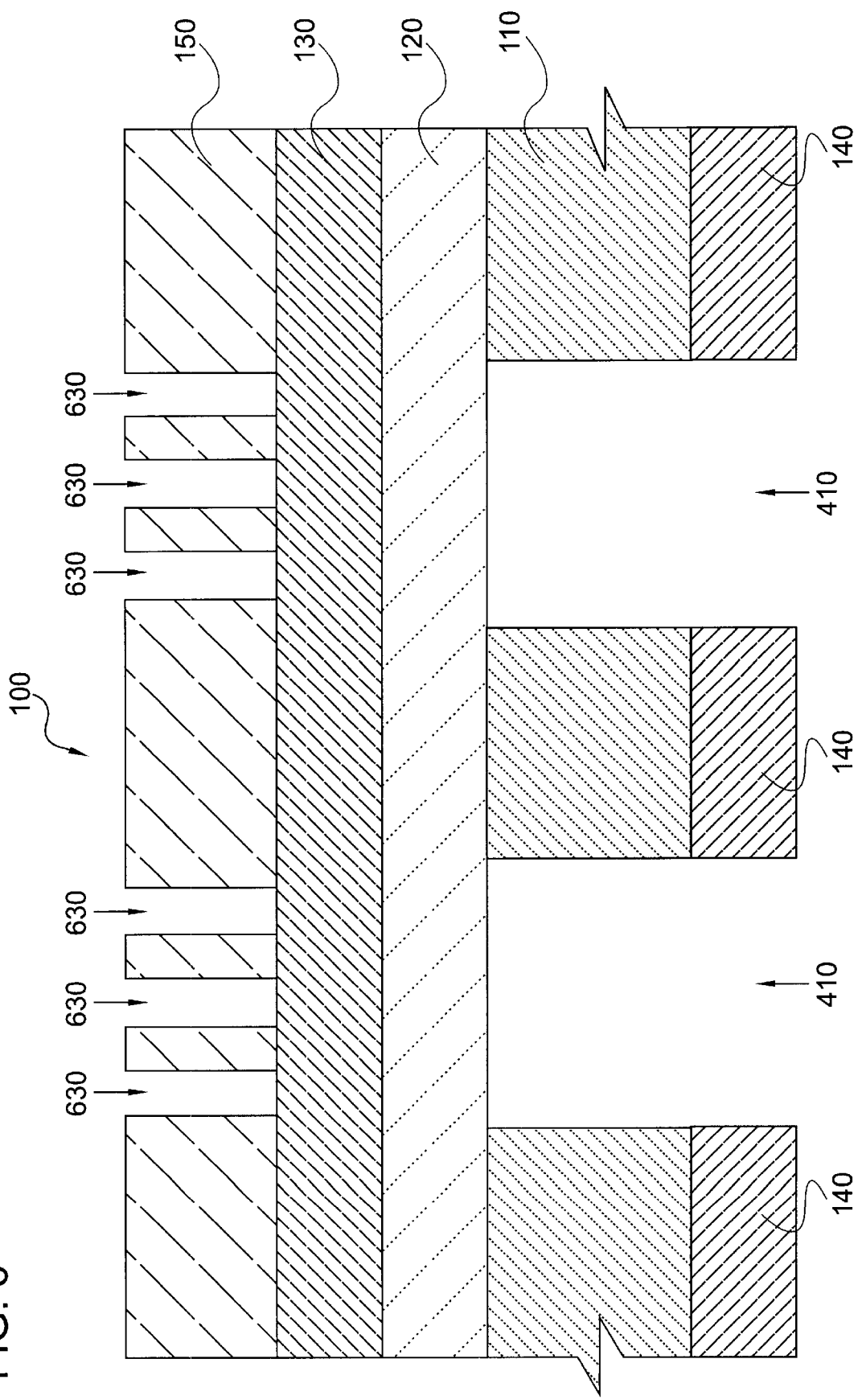

FIG. 6 illustrates a substrate at the conclusion of step 980. As can be seen in FIG. 6, several openings 630 have been formed to the diamond layer 150. The buried oxide layer 120 has served as an etch stop to prevent over etching and to allow the complete etching of the diamond layer 150.

The final step 990 of method 900 is to remove the buried oxide layer 120 and nucleation layer 130 from the substrate by etching from the backside. This may be done in single or multiple etches, but at present separate etches are likely to be used in step 990. Removing the buried oxide and nucleation layers allows the openings 630 in the diamond layer 150 to transmit electrons when used as a stencil. One familiar with the art will appreciate the methods and techniques that may be utilized in the removal of the buried oxide and nucleation layers. While the present invention is not limited to any particular etch process that may be used in step 990, the preferred method of removing the buried oxide layer 120 is to employ a wet hydrofluoric acid etch. The preferred method of removing the nucleation layer 130 is to employ a wet potassium hydroxide etch although one skilled in the art will realize that a variety of etch chemistries may be used. Alternatively, other etch processes, such as a dry reactive ion etch, may be used to remove the buried oxide layer 120, the nucleation layer 130, or both.

FIG. 7 illustrates a substrate 100 after portions of the buried oxide layer 120 have been removed in the shafts 410 to define the membrane. As can be seen in FIG. 7, the nucleation layer 130 remains for subsequent removal in step 990.

A substrate 100 at the conclusion of step 990 of the method 900 is illustrated in FIG. 8. As shown in FIG. 8, in shafts 410 the diamond layer 150 is a fully exposed membrane. Openings 630 through the diamond layer 150 allow the transmission of electrons or other radiation through those portions of the membrane.

It is to be noted that the steps of the method in accordance with the present invention may be varied in their particulars and in their order without departing from the scope and spirit of the invention disclosed herein. For example, step 940 may be appropriately moved to be performed after step 960. This modification of the method 900 could be used to improve the yield of the process.

While the present invention was discussed as being used in conjunction with a diamond layer, the methods in accordance with the present invention may be used advantageously with other materials that are difficult to form, such as oxides and ceramics. In the event that such other materials were to be used, the material comprising the nucleation layer should be selected to facilitate the formation of such a material.

Of course, one skilled in the art will realize that numerous other variations may be made to the method and structures described herein without departing from the scope of the invention and its broader aspects. The present invention is not limited to the use of particular types of resists or lithographic exposure techniques. Likewise, the invention as disclosed herein is not limited to particular methods of forming a buried oxide layer. Moreover, the method disclosed herein may be implemented for the formation of stencils of materials other than diamond, although diamond is presently the only known material likely to be utilized in this way.

I claim:

1. A method for forming a substrate for a stencil mask, comprising the steps of:
   (a) forming a buried oxide layer on a front side of a silicon substrate;
   (b) forming a thin nucleation layer that nucleates diamond growth on the buried oxide layer; and
   (c) growing on the surface of the nucleation layer a thin diamond film.

2. The method of claim 1, wherein the nucleation layer comprises a layer of crystalline silicon.

3. The method of claim 2, wherein the nucleation layer is between about 5 nanometers and 1 micron in thickness.

4. The method of claim 2, wherein the nucleation layer is between about 50 nanometers and 100 nanometers in thickness.

5. The method of claim 2, wherein the nucleation layer is about 100 nanometers in thickness.

6. The method of claim 2, further comprising the step of roughening the nucleation layer.

7. The method of claim 1, wherein the nucleation layer comprises a layer of amorphous carbon.

8. The method of claim 1, wherein the nucleation layer comprises a layer of silicon carbide.

9. The method of claim 1, wherein the nucleation layer comprises amorphous silicon.

10. The method of claim 1, wherein the nucleation layer comprises polycrystalline silicon.

11. The method of claim 1, further comprising the step of roughening the nucleation layer.

12. The method of claim 11, wherein the step of roughening the nucleation layer comprises sputtering the nucleation layer.

13. The method of claim 1, wherein the step of forming a buried oxide layer comprises creating an oxide layer through chemical vapor deposition.

14. The method of claim 13, wherein the step of forming a nucleation layer comprises forming the nucleation layer on the oxide layer by sputtering.

15. The method of claim 13, wherein the step of forming a nucleation layer comprises forming the nucleation layer on the oxide layer by chemical vapor deposition.

16. The method of claim 13, wherein the step of forming a nucleation layer comprises forming the nucleation layer on the oxide layer by evaporation.

17. The method of claim 1, wherein the step of forming a buried oxide layer comprises creating an oxide layer through thermal oxidation.

18. The method of claim 17, wherein the step of forming a nucleation layer comprises forming the nucleation layer on the oxide layer by sputtering.

19. The method of claim 17, wherein the step of forming a nucleation layer comprises forming the nucleation layer on the oxide layer by chemical vapor deposition.

20. The method of claim 17, wherein the step of forming a nucleation layer comprises forming the nucleation layer on the oxide layer by evaporation.

21. The method of claim 1, wherein the steps of forming a buried oxide layer and forming a nucleation layer comprise providing a silicon on oxide wafer.

22. The method of claim 21, wherein the silicon on oxide wafer is prepared using a sacrificial wafer method.

23. The method of claim 21, wherein the silicon on oxide wafer is prepared using oxygen implantation.

24. A substrate to be used in forming stencil masks, the substrate comprising:
   a silicon substrate having a front side and a back side;
   a thin nucleation layer on the front side of the silicon substrate;
   a buried oxide layer below the nucleation layer; and
   a diamond film on the nucleation layer.

25. The substrate of claim 24, wherein the nucleation layer comprises a layer of crystalline silicon.

26. The substrate of claim 24, wherein the nucleation layer comprises a layer of amorphous carbon.

27. The substrate of claim 24, wherein the nucleation layer comprises silicon carbide.

28. The substrate of claim 24, wherein the nucleation layer comprises amorphous silicon.

29. The substrate of claim 24, wherein the nucleation layer comprises polycrystalline silicon.

30. The substrate of claim 24, wherein the nucleation layer has a thickness of between about 5 nanometers and about 1 micron.

31. The substrate of claim 24, wherein the nucleation layer has a thickness of between about 50 nanometers and about 100 nanometers.

32. A method for forming a stencil mask, comprising the steps of:
   (a) providing a substrate having a front side and a backside;
   (b) forming an etch stop layer on the front side of the substrate;
   (c) forming a nucleation layer on the etch stop layer;
   (d) growing a film on the nucleation layer;
   (e) patterning the backside of the substrate, the patterning exposing a portion of the etch stop layer;
   (f) patterning the film, the patterning defining openings in the film layer that define the stencil; and
   (g) removing the exposed portions of the etch stop layer and nucleation layer to expose the openings in the film.

33. The method of claim 32, wherein the film comprises diamond.

34. The method of claim 32, wherein the film comprises a ceramic.

35. The method of claim 32, wherein the film comprises an oxide.

36. The method of claim 32, wherein the etch stop layer comprises silicon oxide.

37. The method of claim 32, wherein the etch stop layer comprises silicon nitride.

38. The method of claim 32, wherein the etch stop layer comprises silicon oxynitride.

39. The method of claim 32, wherein the etch stop layer comprises aluminum oxide.

40. The method of claim 32, wherein the etch stop layer comprises aluminum nitride.

41. The method of claim 32, wherein the etch stop layer comprises silicon carbide.

* * * * *